United States Patent [19]

Geipel, Jr. et al.

[11] Patent Number: 4,631,219
[45] Date of Patent: Dec. 23, 1986

[54] GROWTH OF BIRD'S BEAK FREE SEMI-ROX

[75] Inventors: Henry J. Geipel, Jr.; Pai-Hung Pan, both of Essex Junction, Vt.

[73] Assignee: International Business Machines Corporation, Armonk, N.Y.

[21] Appl. No.: 696,824

[22] Filed: Jan. 31, 1985

[51] Int. Cl.$^4$ .............................................. B32B 15/04
[52] U.S. Cl. .................................. 428/131; 428/137; 428/192; 428/446; 428/698
[58] Field of Search ............... 428/446, 192, 131, 137, 428/698, 699

[56] References Cited

U.S. PATENT DOCUMENTS

| | | | |
|---|---|---|---|
| 3,966,514 | 6/1976 | Feng et al. | 148/187 |
| 4,173,674 | 11/1979 | Mimura et al. | 428/698 X |
| 4,187,344 | 2/1980 | Fredericksson | 428/698 X |
| 4,271,583 | 6/1981 | Kahny et al. | 29/571 |
| 4,312,899 | 1/1982 | Lahmann | 428/698 X |
| 4,416,952 | 11/1983 | Nishizawa et al. | 428/698 |
| 4,455,351 | 6/1984 | Camlibel et al. | 428/446 X |

OTHER PUBLICATIONS

Ho et al, "Elimination of Bird's Beak in ROI Process", IBM *Technical Disclosure Bulletin*, vol. 24, No. 2, Jul. 1981, pp. 1290-1292.

Chui et al, "A Bird's Beak Free Local Oxidation Technology Feasible for VLSI Circuits Fabrication", *IEEE Transactions on Electron Device* vol. ED-29, No. 4, Apr. 1982, pp. 536-540.

Gaind et al, "Physicochemical Properties of Chemical Vapor-Deposited Silicon Oxynitride from a $SiH_4$-$CO_2$-$NH_3$-$H_2$ System", *J. Electrochem Soc.: Solid-State Science and Technology*, vol. 125, No. 1, Jan. 1978, pp. 139-145.

Primary Examiner—Nancy Swisher
Attorney, Agent, or Firm—Mark F. Chadurjian

[57] ABSTRACT

An oxygen-impervious pad structure which reduces the bird's beak profiles in semi-recessed oxide isolation regions. The sidewalls of a conventional silicon oxide - silicon nitride pad are coated with a thick layer of oxynitride. A thin layer of oxynitride is grown on the substrate surface prior to deposition of the thick oxynitride layer. The thick oxynitride layer prevents lateral oxidizing specie diffusion through the oxide layer of the conventional pad, and the thin oxynitride layer prevents lateral oxidizing specie diffusion through the pad-substrate interface into the substrate region beneath the pad.

13 Claims, 6 Drawing Figures

GROWTH OF BIRD'S BEAK FREE SEMI-ROX

TECHNICAL FIELD

The invention relates to a method of forming semi-recessed oxidation isolation regions in which bird's beak formations are substantially eliminated.

BACKGROUND ART

For many years, oxide isolation regions have been used to electrically isolate adjacent active devices formed on a semiconductor substrate. These structures can be fully recessed ("ROX"), wherein the upper surface of the oxide region is substantially planar with the upper surface of the substrate; or semi-recessed, wherein the upper surface of the oxide region extends above the upper surface of the substrate.

One common method of forming these regions includes the steps of forming a silicon oxide layer on the substrate, forming a silicon nitride layer on the oxide, and patterning these two layers in order to form an oxygen-impervious "pad". The pad is formed in an area of the substrate where the active devices will be formed. When the substrate is subsequently oxidized, the portions of the substrate left unprotected by the pad oxidize much faster than does the pad itself, thus forming oxide isolation regions between areas of the substrate where the active devices will be formed.

A problem with the above method of forming oxide isolation regions is the formation of the so-called "bird's beak structures". While the unprotected regions of the substrate are oxidized, oxygen impurities (generally referred to as "oxidizing specie") laterally diffuse through the silicon oxide layer of the pad into the protected portions of the substrate. This diffusion causes the sidewalls of the oxide isolation regions to slope inwardly into the protected substrate portions, such that the sidewall profiles resemble a bird's beak.

Several methods have been proposed for eliminating or reducing the formation of these bird's beak profiles. In an article by Ho et al ("Elimination of Bird's Beak in ROI Process", *IBM Technical Disclosure Bulletin*, Vol. 24, No. 2, July 1981, pp. 1290–1291) a method of reducing bird's beak is disclosed in which the pad is made up of silicon oxide, silicon nitride and silicon oxide layers. The sides of the pad are protected by a layer of silicon nitride. Thus, when the surrounding substrate is oxidized, the silicon nitride on the sidewalls of the pad greatly reduces the lateral diffusion of oxidizing specie through the SiO$_2$ layer of the pad. The idea of using silicon nitride as a protective coating on the sidewalls of a pad is also shown in Chui et al, "A Bird's Beak Free Local Oxidation Technology Feasible for VLSI Circuits Fabrication", *IEEE Transactions on Electron Devices*, Vol. ED-29, No. 4, April, 1982, pp. 536–540.

While these methods do result in a reduction of bird's beak profiles, they present several difficulties. In general, silicon nitride produces film stresses when it is deposited on a silicon substrate and subjected to heating. These stresses (in order of $1 \times 10^{10}$ dynes/cm$^2$) are large enough to disturb the crystal lattice of the underlying silicon. In both the Ho and Chui articles, the silicon nitride which is formed on the sidewalls of the pad abuts the silicon substrate, subjecting the substrate to these high film stresses.

Accordingly, it would be advantageous to construct an oxygen-impervious pad in which the pad sidewalls are coated with a material which prohibits lateral diffusion of oxygen while not subjecting the underlying substrate to high film stresses.

SUMMARY OF THE INVENTION

It is thus an object of the invention to produce oxide isolation regions which are substantially free of bird's beak profiles.

It is another object of the invention to provide an improved oxygen-impervious pad structure.

It is a further object of the invention to provide a pad structure which prohibits lateral diffusion of oxygen while producing minimal film stress on the underlying silicon substrate.

It is yet another object of the invention to protect the sidewalls of the pad with a material which is deposited on the pad sidewalls and thermally grown on the substrate surface, the thermally grown material prohibiting oxygen specie diffusion into the portion of the substrate beneath the pad.

These and other objects of the present invention are realized by an improved oxygen-impervious pad which prohibits lateral oxygen specie diffusion while producing a minimal amount of film stresses on the substrate. A conventional silicon oxide - silicon nitride pad is formed in regions of the substrate where active devices are to be formed. An anneal is then performed in order to grow a thin layer of oxynitride on the substrate. A thick layer of oxynitride is then deposited over the substrate as well as the pad. The thick oxynitride is etched to form sidewall spacers which protect the sidewalls of the pad. The thin oxynitride forms a boundary layer between the thick oxynitride sidewall spacers and the underlying substrate. The thick oxynitride prohibits lateral oxidizing specie diffusion into the pad, and the thin oxynitride prohibits lateral oxidizing specie diffusion through the silicon-pad interface into the portion of the substrate lying beneath the pad. Moreover, since oxynitride does not produce the high film stresses associated with silicon nitride, disruption of the crystal lattice of the underlying silicon is substantially eliminated.

BRIEF DESCRIPTION OF THE DRAWING

These and other structures and teachings of the invention will become more apparent upon a detailed description of the best mode for carrying out the invention. In the description to follow, reference will be made to the accompanying drawing, in which.

BEST MODE FOR CARRYING OUT THE INVENTION

Figure 1:
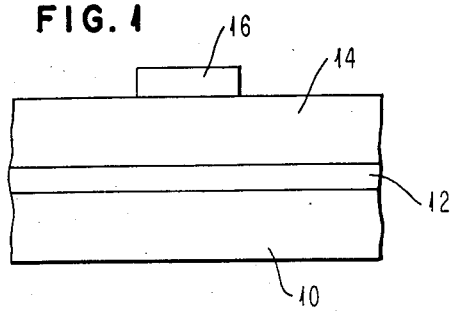
FIGS. 1–6 are cross-sectional views of a silicon substrate undergoing the various process steps of the invention.

As shown in FIG. 1, an oxide layer 12 is formed on a silicon substrate 10. The oxide is grown in a steam ambient, using conventional temperatures and pressures. Oxide layer 12 must be thick enough (e.g. 250–450 Å) to protect the underlying substrate 10 from high film stresses produced by the silicon nitride subsequently formed on the oxide layer 12, as described below.

A layer of silicon nitride 14 is then deposited on oxide layer 12 using conventional LPCVD techniques. Silicon nitride layer 14 must be thick enough (typically 300–1000 Å) to prevent diffusion of oxidizing specie into the underlying layers.

Silicon nitride layer 14 and oxide layer 12 are then etched to form a conventional oxygen-impervious pad structure 100 on the surface of substrate 10. A photoresist layer is applied, exposed and developed to form a mask 16, and the underlying layers are reactive ion etched (RIE) through the mask. By way of example, the nitride is etched in a $CF_4$ atmosphere and the oxide is etched in a $CHF_3$ atmosphere. Other gasses known to etch these layers could be used.

Figure 2:
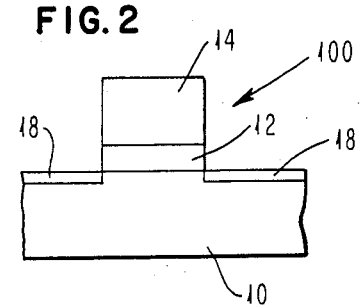

As shown in FIG. 2, the resulting pad structure has substantially vertical sidewalls. The photoresist mask 16 is removed after completion of the RIE etch step.

After this etch step is completed, the substrate is briefly annealed in a furnace having a $NH_3$ atmosphere for a time sufficient to form a thin (50 Å) layer 18 of silicon oxynitride ($Si_xO_yN_z$) on the surface of the substrate 10. In a conventional furnace, the anneal is carried out at 1000° C.–1200° C. for 15–60 minutes. Other techniques of annealing may be used, so long as the parameters are adjusted to produce a relatively thin oxynitride layer (a thicker layer of oxynitride could be formed, but it is unnecessary). For example, in using the so-called "rapid thermal annealing" method, the anneal is carried out for approximately 1 minute. There is a possibility that under the proper conditions (e.g. absolutely pure $NH_3$ used as the anneal gas) silicon nitride may be formed instead of oxynitride; however, the probability of this substitution is extremely small. Moreover, even if this substitution takes place, the 50 Å thickness and high deposition temperature of this layer would appreciably reduce the resulting film stresses.

Figure 3:
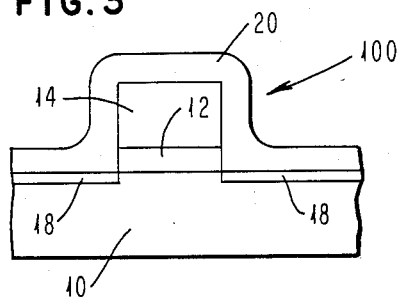

As shown in FIG. 3, the substrate is then coated with a second layer 20 of silicon oxynitride. The oxynitride can be deposited by using either LPCVD or PECVD techniques. Using LPCVD the deposition pressure should be approximately 0.3 Torr and the gasses $SiH_2Cl_2$, $NH_3$ and $N_2O$ should be introduced into the chamber during deposition. The resulting oxynitride layer should be thick enough to retard diffusion of oxidizing specie. Accordingly, the resulting oxynitride layer should be approximately 500–1000 Å in thickness, and should have a refractive index $\eta$ in the order of 1.75–1.80.

Figure 4:
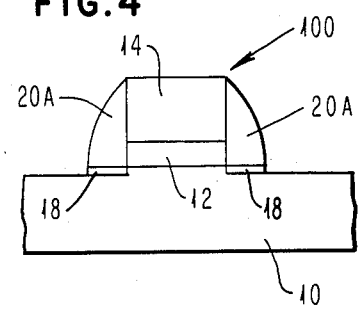

The resulting structure is then anisotropically etched such that oxynitride layer 20 remains on the sidewalls of pad structure 100 (to form sidewall spacers 20A) and oxynitride layer 18 remains between oxynitride layer 20 and substrate 10, resulting in the pad of the invention. The region of the sidewall spacers 20A near substrate 10 is approximately 500–1000 Å thick. See FIG. 4. These layers must be reactive ion etched (RIE) in an atmosphere which results in a highly selective etch (i.e. etching must cease as soon as the underlying substrate 10 is exposed). An example of such an atmosphere is $CF_4+O_2+H_2$. Freon 23 ($CHF_3$) or Freon 12 ($CCl_2F_2$) may be substituted for the carbon tetrafloride ($CF_4$). "Freon 12" and "Freon 23" are both trade names of the Du Pont Corporation of Wilmington, Del.

Prior to oxidation, the substrate 10 is implanted with boron in order to raise the threshold voltage of the resulting oxide isolation regions. Alternatively, boron implantation could be carried out immediately after formation of pad structure 100. During boron implantation, the nitride layer 14 atop oxide layer 12 serves as an implantation mask.

Figure 5:
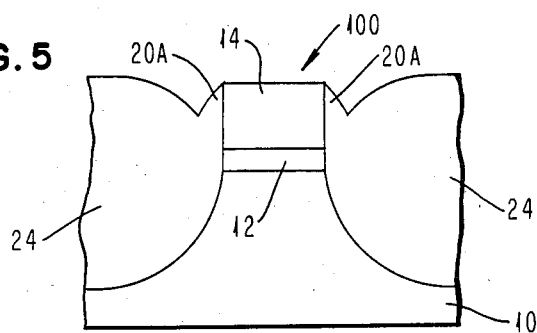

As shown in FIG. 5, the substrate is then subjected to an oxidizing ambient in order to form oxide isolation regions 24. During the growth of the oxide regions 24, the sidewall spacers 20A and oxynitride 18 undergo a chemical reaction by which they are at least partially converted into silicon oxide. The rate of this conversion is much slower than the oxidation rate of the implanted silicon. Thus, although the sidewall spacers 20A are slowly converted into oxides, they prevent the lateral diffusion of oxidizing specie through silicon oxide layer 12 during most of the long oxidation cycle used to grow oxide regions 24. Note that even if oxynitride layer 18 was etched so that it remains only beneath spacers 20A, it will prevent lateral diffusion of oxidizing specie through the pad-substrate interface into the portion of substrate 10 lying beneath the pad, because it is at least 500–1000 Å thick in the lateral direction.

Figure 6:
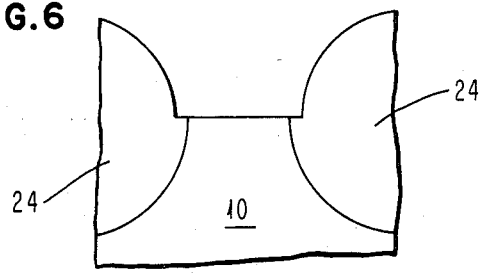

A three-step process is then used to remove the pad. First, the pad is dip etched in a buffered hydroflouric (BHF) solvent in order to remove a portion of the sidewall spacers 20A. That is, since the sidewall spacers are now made up of oxide, they can be removed in oxide etchants such as BHF. Then the pad 100 is RIE or plasma etched in a $CF_4$ atmosphere in order to remove the nitride layer 14. Finally, the remaining structure is again dip etched in BHF in order to remove the remaining sidewall spacer 20A, oxide (formerly oxynitride) layer 18 and oxide layer 12. The resulting oxide regions are shown in FIG. 6.

Thus, as disclosed above, the invention provides an improved oxygen-impervious pad having a first deposited oxynitride layer coated on the sidewalls of an oxide-nitride pad structure, and a second thermally grown oxynitride layer disposed between the first oxynitride layer and the substrate. The first oxynitride layer protects the pad from lateral oxidizing specie diffusion through the pad oxide layer, and the second oxynitride layer protects the portion of the substrate lying beneath the pad from oxidizing specie penetration. Moreover, since oxynitride produces a negligible amount of film stress (as compared to silicon nitride) on the silicon substrate, the silicon crystal lattice is not degraded as in the case of the silicon nitride spacers disclosed in the prior art.

It is to be understood that modifications can be made to the structures and teachings as disclosed above without departing from the spirit and scope of the present invention.

What is claimed is:

1. An oxygen-impervious pad formed on a surface of a semiconductor substrate, comprising:
   a pad structure disposed on the surface of the substrate, said pad structure having an upper surface which is impervious to oxygen specie diffusion therethrough;
   sidewall spacers disposed on said pad structure, said sidewall spacers being formed of a material impervious to oxygen specie diffusion therethrough; and
   a thin layer of silicon oxynitride grown on said surface of said substrate and disposed below said sidewall spacers, said thin layer of silicon oxynitride preventing diffusion of oxygen specie beneath said sidewall spacers into said portion of the substrate beneath said pad structure.

2. The pad as recited in claim 1, wherein said upper surface of said pad structure is comprised of a first oxygen-impervious material, and wherein said sidewall spacers of said pad structure are comprised of a second oxygen-impervious material.

3. The pad as recited in claim 2, wherein said pad structure comprises a layer of silicon oxide and a layer of silicon nitride overlaying said layer of silicon oxide, said silicon nitride and silicon oxide layers being etched to form substantially vertical sidewalls which are protected by said sidewall spacers, said sidewall spacers being comprised of silicon oxynitride.

4. The pad as recited in claim 2, wherein said first oxygen-impervious material produces a greater amount of film stress on the substrate than does said second oxygen-impervious material.

5. The pad as recited in claim 4, wherein said first oxygen-impervious material comprises silicon nitride.

6. The pad as recited in claim 5, wherein said second oxygen-impervious material is comprised of silicon oxynitride.

7. An oxygen-impervious pad formed on a surface of a semiconductor substrate, comprising:
   a layer of silicon oxide overlaying the substrate;
   a first oxygen-impervious layer overlaying said silicon oxide layer, said first oxygen-impervious layer and said silicon oxide layer being etched to form a pad structure having substantially vertical sidewalls;
   a second oxygen-impervious layer formed of a material providing a negligible degree of film stress on said substrate, said second oxygen-impervious layer overlaying said sidewalls of said pad structure to form sidewall spacers; and
   a thin layer of silicon oxynitride grown on said surface of said substrate and disposed below said sidewall spacers, said thin layer of silicon oxynitride preventing diffusion of oxygen specie beneath said second oxygen-impervious layer into a portion of the substrate beneath said pad structure.

8. The pad as recited in claim 7, wherein said first oxygen-impervious layer produces a greater amount of film stress on the substrate than do said second and third oxygen-impervious layers.

9. The pad as recited in claim 8, wherein said first oxygen-impervious layer is comprised of silicon nitride.

10. The pad as recited in claim 8, wherein said second oxygen-impervious layer is comprised of silicon oxynitride.

11. The pad as recited in claim 10, wherein said second oxygen-impervious layer has a refractive index $\eta$ in the range of 1.75 to 1.80.

12. The pad as recited in claim 8, wherein said third oxygen-impervious layer is comprised of silicon oxynitride.

13. A plurality of oxygen-impervious pads disposed on portions of an exposed surface of a semiconductor substrate, the pads preventing the formation of bird's beak profiles in oxide isolation regions grown on portions of the substrate other than those portions lying beneath the pads, each of the oxygen-impervious pads comprising:
   a layer of silicon oxide overlaying the semiconductor substrate;
   a layer of silicon nitride deposited on said layer of silicon oxide, said layer of silicon nitride and said layer of silicon oxide being etched to form a pad structure having substantially vertical sidewalls;
   a thick layer of silicon oxynitride disposed on said sidewalls of said structure, said thick layer of oxynitride having a thickness that decreases as a function of relative distance from the surface of the semiconductor substrate; and
   a thin layer of silicon oxynitride grown on said surface of said substrate and disposed below said thick layer of silicon oxynitride, said thin and thick layers of silicon oxynitride imparting a negligible amount of field stress on the semiconductor substrate, said thick layer of silicon oxynitride preventing diffusion of oxygen specie through said sidewalls of said pad structure, and said thin layer of oxynitride preventing diffusion of oxygen specie beneath said thick layer of silicon oxynitride into said portions of the substrate lying beneath the pads.

* * * * *